(12) United States Patent
Risch et al.

(10) Patent No.: US 6,300,652 B1
(45) Date of Patent: Oct. 9, 2001

(54) MEMORY CELL CONFIGURATION AND METHOD FOR ITS PRODUCTION

(75) Inventors: Lothar Risch, Neubiberg; Franz Hofmann; Rainer Bruchhaus, both of München; Wolfram Wersing, Kirchheim, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 08/755,456

(22) Filed: Nov. 22, 1996

(30) Foreign Application Priority Data

Nov. 22, 1995 (DE) ................................. 195 43 539

(51) Int. Cl.$^7$ .......................... H01L 27/108; H01L 29/76; H01L 29/94; H01L 31/119
(52) U.S. Cl. ........................... 257/296; 257/303; 257/306
(58) Field of Search ................................. 257/296, 295, 257/303, 306, 240; 438/244, 253, 245

(56) References Cited

U.S. PATENT DOCUMENTS

| | | | | |
|---|---|---|---|---|
| 5,155,573 | * | 10/1992 | Abe et al. | 257/304 |
| 5,499,207 | * | 3/1996 | Miki et al. | 257/295 |
| 5,604,696 | * | 2/1997 | Takaishi | 257/303 |
| 5,619,393 | * | 4/1997 | Summerfelt et al. | 438/396 |
| 5,757,612 | * | 5/1998 | Acosta et al. | 257/303 |
| 5,793,076 | * | 8/1998 | Fazan et al. | 257/298 |
| 5,796,133 | * | 8/1998 | Kwon et al. | 257/296 |

FOREIGN PATENT DOCUMENTS

| | | |
|---|---|---|
| 43 36 001.7 | 10/1993 | (DE) . |
| 195 15 347 A1 | 11/1995 | (DE) . |
| 05 34 3615 A | 12/1993 | (JP) . |

OTHER PUBLICATIONS

German Priority Document No. 43 36 001.7 (Wersing et al.), dated Oct. 21, 1993, condenser arrangement and method for its production.

* cited by examiner

Primary Examiner—Olik Chaudhuri
Assistant Examiner—Phat X. Cao
(74) Attorney, Agent, or Firm—Herbert L. Lerner; Laurence A. Greenberg; Werner H. Stemer

(57) ABSTRACT

A memory cell configuration and a method for its production include stacked capacitors and use a vertical storage capacitor having a ferroelectric or paraelectric storage dielectric. In order to produce the storage capacitor, a dielectric layer for the storage dielectric is produced over the whole area. The dielectric layer is subsequently structured and first electrodes and second electrodes for the storage capacitors are formed. The invention is suitable for Gbit DRAMs and for nonvolatile memories.

24 Claims, 4 Drawing Sheets

MEMORY CELL CONFIGURATION AND METHOD FOR ITS PRODUCTION

BACKGROUND OF THE INVENTION

Field of the Invention

The invention relates to a memory cell configuration and a method for producing the memory cell configuration.

Memory cell configurations, both for DRAM applications and for non-volatile memories, have an increased storage density from generation to generation.

In DRAM cell configurations, use is made almost exclusively of so-called single-transistor memory cells. A single-transistor memory cell includes a read-out transistor and a storage capacitor. The information is stored in the storage capacitor in the form of an electric charge, which represents a logic value, zero or one. That information can be read out through a bit line by driving the read-out transistor through a word line. The storage capacitor must have a minimum capacitance in order to reliably store the charge and at the same time be able to distinguish between the information read out. The lower limit for the capacitance of the storage capacitor is currently regarded as 20 fF.

Since the storage density increases from memory generation to memory generation, the required area of the single-transistor memory cell must be reduced from generation to generation. At the same time, the minimum capacitance of the storage capacitor must be maintained.

Up until the 1 Mbit generation, both the read-out transistor and the storage capacitor were realized as planar components. Starting with the 4 Mbit memory generation, a further deduction in the area of the memory cell was achieved through the use of a three-dimensional configuration of the read-out transistor and the storage capacitor. One possibility is to realize the storage capacitor in a trench. In that case, the electrodes of the storage capacitor are disposed along the surface of the trench. That increases the effective area of the storage capacitor, upon which the capacitance depends, as compared with the space requirement at the surface of the substrate for the storage capacitor, which corresponds to the cross-section of the trench.

A further possibility for increasing the storage capacitance with the space requirement of the storage capacitor remaining the same or being reduced is constructing the storage capacitor as a stacked capacitor. In that case, a polysilicon structure, for example a cylinder, a crown structure or a rib structure (FIN), is formed over the word lines and makes contact with the substrate. That polysilicon structure forms the storage node. It is provided with a capacitor dielectric and a capacitor plate. In that case, the free space above the substrate surface is utilized for the storage capacitor. The entire cell area can be covered by the polysilicon structure as long as the polysilicon structures for adjacent memory cells are insulated with respect to one another. That concept has the advantage of being largely compatible with a logic process.

The area for a memory cell of a DRAM belonging to the 1 Gbit generation should only be about 0.2 $\mu m^2$. In order to realize the minimum capacitance for the storage capacitor of approximately 25 fF on an area of that type, it is necessary, in the case of a trench capacitor concept, for the active trench depth to be at least 8 $\mu m$ in conjunction with a trench width of 0.3 $\mu m$ and a dielectric having an oxide-equivalent thickness of 4 nm. Trenches having dimensions of that type can only be realized by using complicated etching processes with long etching times. In a stacked capacitor concept, those demands on the area requirement of a memory cell can only be realized with a relatively complicated structure of the polysilicon structure. In addition, those complicated structures are more and more difficult to produce due to their topology.

A further increase in the capacitance that can be attained per unit of area is achieved by the use of so-called high-epsilon dielectrics as a storage dielectric in the storage capacitor (see, for example, the paper by P. C. Fazan, entitled: Trends in, the Development of ULSI DRAM Capacitors, in Integrated Ferroelectrics, Volume 4 (1994), pages 247 to 256). High-epsilon dielectrics are ferroelectric or paraelectric materials. The capacitor is constructed as a stacked capacitor in those concepts. To that end, a lower electrode is first produced by layer deposition and structuring. The high-epsilon dielectric is deposited thereon. Finally, an upper capacitor electrode is applied, structured and provided with an electrical contact. Since high-epsilon dielectrics are deposited at temperatures in the range of 700 to 800° C., at which many electrode materials react, only specific materials, for example TiN, Pt, W, $RuO_2$, $Ir_2O_3$ or Pd, are suitable for the lower electrodes. The search for further materials which are suitable for the lower electrode is the subject of worldwide research activity.

SUMMARY OF THE INVENTION

It is accordingly an object of the invention to provide a memory cell configuration and a method for its production, which overcome the hereinafore-mentioned disadvantages of the heretofore-known devices and methods of this general type and in which the memory cell configuration is suitable for large scale integrated DRAMs belonging to the 1 Gbit and subsequent generations and can be produced with reduced process complexity as compared with known solutions.

With the foregoing and other objects in view there is provided, in accordance with the invention, a memory cell configuration, comprising a multiplicity of individual memory cells each including a selection transistor and a storage capacitor in a semiconductor layer structure; substantially parallel bit lines and substantially parallel word lines, the bit lines and the word lines extending transversely relative to one another; an insulating layer; at least the selection transistors being disposed below the insulating layer; the storage capacitors being disposed on the insulating layer; each of the storage capacitors including a first electrode, a storage dielectric and a second electrode; the storage dielectric having ferroelectric or paraelectric material; and the first electrode, the storage dielectric and the second electrode each being disposed next to one another above the insulating layer.

The memory cell configuration according to the invention includes a multiplicity of individual memory cells, each of which include a selection transistor and a storage capacitor. In this case, the storage capacitors are disposed according to the manner of stacked capacitors in a plane above the selection transistors. The selection transistors are covered with an insulating layer.

The storage capacitors each include a first electrode, a storage dielectric and a second electrode. In this case, the first electrode, the storage dielectric and the second electrode are each disposed next to one another above the insulating layer. The capacitance of the storage capacitor is determined by the area between the first electrode and the storage dielectric, and the second electrode and the storage dielectric. This area and therefore the capacitance of the storage capacitor can be adjusted in the configuration according to the invention by way of the height of the first and second electrodes and of the storage dielectric.

Although a capacitor configuration for memories with a vertical capacitor has already been proposed in German Published, Non-Prosecuted Patent Application DE 43 36 001 A1, the storage dielectric used therein is a monocrystalline, ferroelectric layer, with the result that the capacitor can only be produced on a monocrystalline substrate. The known capacitor configuration is therefore unsuitable for a stacked capacitor configuration.

Ferroelectric and/or paraelectric material is used as the storage dielectric. Ferroelectric and paraelectric material are crystalline materials having a polar lattice. The ionic bond is predominant in these materials. They have a high dielectric constant $\in$. The dielectric constant $\in$ of many ferroelectric and paraelectric material is between 300 and 1000. In contrast, amorphous dielectrics, such as, for example, $SiO_2$ or $Si_3N_4$ have dielectric constants $\epsilon$ of about 3. The increased charge storage in ferroelectric and paraelectric materials is explained by higher charge transfer as a result of molecular dipoles.

In the case of DRAM applications, use is preferably made of paraelectric materials as a storage dielectric, since in those applications the polarization is linearly dependent on an applied electric field. Ferroelectric materials are preferably used for non-volatile memories, since those materials have spontaneous polarization which is also present in the absence of an applied electric field. In non-volatile memories, the orientation of the polarization, which can be changed over by an applied electric field, is assigned to the logic variables zero and one.

In accordance with another feature of the invention, the storage dielectric is selected from the following ferroelectric materials: lead zirconate titanate, $BaTiO_3$, lead lanthanum titanate, strontium bismuth titanate $SrBi_2Ta_2O_9$, bismuth titanate $Bi_4Ti_3O_{12}$, or the following paraelectric materials: barium strontium titanate, strontium titanate, barium zirconate titanate.

In accordance with a further feature of the invention, the bit lines and the word lines are disposed below the insulating layer.

In accordance with an added feature of the invention, the storage dielectric annularly surrounds the first electrode; the second electrodes each annularly surround the storage dielectric; and the second electrodes of adjacent storage capacitors are connected to one another.

In accordance with an additional feature of the invention, there is provided a capacitor plate disposed above the first electrodes and the storage dielectrics and insulated from the first electrodes, the capacitor plate connecting the second electrodes to one another.

With the objects of the invention in view there is also provided a method for producing a memory cell configuration, which comprises producing a semiconductor layer structure having a multiplicity of individual memory cells each including a selection transistor and a storage capacitor; initially producing the selection transistors, bit lines and word lines in the semiconductor layer structure; producing an insulating layer covering the selection transistors; producing a whole-area dielectric layer; producing first openings in the dielectric layer having a depth corresponding at least to a thickness of the dielectric layer; forming first electrodes for the storage capacitors in the first openings; producing second openings in the dielectric layer having a depth corresponding at least to the depth of the dielectric layer; forming second electrodes for the storage capacitor in the second openings; and forming cell contacts each between a respective one of the first electrodes and a respective one of the selection transistors.

In order to produce the memory cell configuration according to the invention, the selection transistors are first of all produced in a semiconductor layer structure and covered with an insulating layer. A dielectric layer made of the material for the storage dielectrics is then produced over the whole area. First openings, having a depth which corresponds at least to the thickness of the dielectric layer, are formed in the dielectric layer. That is to say, the first openings reach through the entire thickness of the dielectric layer. The first electrodes are formed in the first openings. Furthermore, second openings, having a depth which corresponds at least to the thickness of the dielectric layer, are produced in the dielectric layer. The second openings, too, pass through the entire thickness of the dielectric layer. The second electrodes for the storage capacitor are formed in the second openings. A cell contact is formed between the first electrodes and the respectively associated selection transistor. The cell contact is produced in the insulating layer. The first openings preferably extend to the respective cell contact.

Since in the method according to the invention the dielectric layer is produced first and the first and second electrodes are only formed later, the first and second electrodes are not subjected to the temperature loads during the formation of the dielectric layer made of paraelectric or ferroelectric material. This alleviates the material problem for the first and second electrodes of the storage capacitor and above all for a conductive barrier between the drain of the selection transistor and the electrode of the capacitor.

In accordance with another mode of the invention, the word lines and the bit lines are likewise produced before the deposition of the dielectric layer and covered with the insulating layer. The memory cell configuration is then complete except for the storage capacitor having the dielectric layer made of paraelectric or ferroelectric material. Following the production of the storage capacitor, which is not VLSI-compatible, additional VLSI process steps are then no longer required.

The insulating layer is preferably produced with a planar surface. This is done, for example, by chemical mechanical polishing. The dielectric layer can be deposited on the planar surface by sputtering or with the aid of the sol-gel process. If the insulating layer does not have a sufficiently planar surface, then the dielectric layer is deposited by using a CVD process.

In accordance with a further mode of the invention, it is advantageous first of all to apply a buffer layer to the surface of the insulating layer, on which buffer layer the dielectric layer made of ferroelectric or paraelectric material grows in a textured manner. Consequently, it is composed of homogeneous material which has constant material properties even in the event of structuring with structure sizes on the order of magnitude of 100 nm. This alleviates problems which occur when using polycrystalline layers with small structure sizes due to the enhanced influence of grain boundaries.

In accordance with an added mode of the invention, the buffer layer is preferably formed from $ZrO_2$, $TiO_2$ or $Ta_2O_5$. Ferroelectrics having a $Bi_2O_3$ oxide layer structure such as, for example, $Bi_4Ti_3O_{12}$ or $SrBi_2Ta_2O_9$ grow in a directly textured manner on this buffer layer. The $Bi_2O_3$ planes in this case are aligned parallel to the surface. If other ferroelectrics such as the generally employed ferroelectrics having a perovskite structure (for example $BaTiO_3$, $PbTiO_3$, $Pb(ZrTi)O_3$) are also to be deposited in a textured manner, then a second thin layer of $Bi_4Ti_3$, $O_{12}$ or the like is first of all deposited over the buffer layer made of $ZrO_2$, on which second thin layer the ferroelectric layer grows in a textured manner.

If the dielectric layer is formed from ferroelectric material, then the textured growth on a buffer layer additionally has the advantage that the dielectric layer has a defined orientation of the spontaneous polarization. The spontaneous polarization in the domains of the ferroelectric layer lies in a plane parallel to the direction of the applied electric field. As a result, the polarization can be changed over from one state to the other. This is particularly advantageous if $Bi_2O_3$-layer ferroelectrics such as, for example, $Bi_4Ti_3O_{12}$ are employed, since the main component of their spontaneous polarization lies parallel to the $Bi_2O_3$ planes and this can be utilized completely for data storage in the present configuration.

In accordance with an additional mode of the invention, in order to form the cell contacts, it lies within the scope of the invention to form contact holes in the insulating layer which are filled with the cell contacts. The first openings in the dielectric layer are subsequently disposed in such a way that the surface of the cell contacts is at least partially exposed in the first openings. In this way the first electrodes subsequently formed in the first openings are directly connected to the cell contacts.

In accordance with yet another mode of the invention, there is provided a method which further comprises forming the dielectric layer of at least one layer of ferroelectric or paraelectric material containing at least one material selected form the group consisting of $BaTiO_3$, $SrTiO_3$, $(Ba,Sr)TiO_3$, $Ba(Ti,Zr)O_3$, lead ziconate titanate, $Bi_4Ti_3O_{12}$ and $SrBi_2Ta_2O_9$.

In accordance with yet a further mode of the invention, there is provided a method which further comprises forming the first openings and the second openings in the dielectric layer in a joint structuring step; annularly surrounding each of the first openings with a respective one of the second openings with a part of the dielectric layer disposed between a respective one of the first openings and a respective one of the second openings; connecting adjacent second openings to one another; and forming the first electrodes and the second electrodes by deposition and etching back of a common conductive layer.

In accordance with a concomitant mode of the invention, there is provided a method which further comprises initially producing the first openings and the first electrodes; providing an insulation layer on at least a surface of the first electrodes; forming the second openings; and forming the second electrodes and a capacitor plate electrically connecting the second electrodes to one another, by deposition of a conductive layer.

Other features which are considered as characteristic for the invention are set forth in the appended claims.

Although the invention is illustrated and described herein as embodied in a memory cell configuration and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
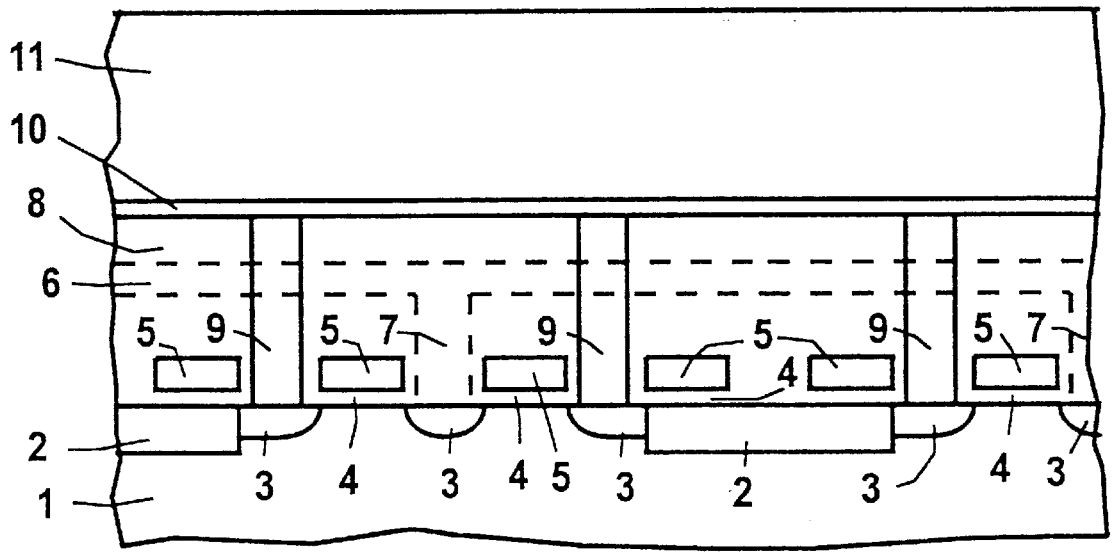
FIG. 1 is a fragmentary, diagrammatic, vertical-sectional view showing a semiconductor layer structure having selection transistors, bit lines, word lines, an insulating layer and cell contacts, to which a buffer layer and a dielectric layer have been applied.

Referring now to the figures of the drawings in detail and first, particularly, to FIG. 1 thereof, there is seen a substrate 1 that is made, for example, of monocrystalline silicon, in which insulation structures 2 are formed for the purpose of insulating adjacent selection transistor pairs in the substrate 1. The insulation structures 2 are formed, for example, from $SiO_2$, for example in a LOCOS process through the use of selective oxidation or in a shallow trench process by etching a trench which is filled with insulating material.

Selection transistor pairs having source/drain regions 3, gate oxide 4 and gate electrodes constructed as word lines 5 are subsequently formed. The selection transistor pairs each have a common source/drain region through which the two selection transistors are connected to one another. The word lines 5 run perpendicularly to a sectional plane across the memory cell configuration.

Bit lines 6 run above the word lines 5, parallel to the sectional plane, and are each electrically connected to the common source/drain region 3 of the selection transistor pairs through bit line contacts 7. The bit lines 6 and the bit line contacts 7 are illustrated by dashed lines in FIG. 1, since they run parallel to the sectional plane but outside the sectional plane.

Selection transistor pairs which belong to adjacent word line pairs in each case are disposed offset in the substrate 1.

An insulating layer 8 that is made, for example, of $SiO_2$ is formed and completely covers the selection transistors, the word lines 5 and the bit lines 6. The insulating layer 8 is formed, for example, by BPSG and subsequent planarization, for example by chemical mechanical polishing. The insulating layer 8 has an essentially planar surface.

Contact holes are subsequently opened in the insulating layer 8 and are provided with cell contacts 9. The cell contacts 9 are formed, for example, from tungsten. The cell contacts 9 each reach down to the outer source/drain regions 3 of the selection transistors (see FIG. 1).

An auxiliary or buffer layer 10 is deposited over the whole area. The auxiliary layer 10 is formed, for example, from $Si_3N_4$ or $ZrO_2$.

A dielectric layer 11 is subsequently deposited over the whole area. The dielectric layer 11 is deposited by sputtering, for example, from strontium titanate in the temperature range from 600 to 700° C. In this case, the dielectric layer 11 is composed of paraelectric material. As an alternative, the dielectric layer 11 can be formed from ferroelectric material by depositing $BaTiO_3$, $Bi_4Ti_3O_{12}$ or lead zirconate titanate in the temperature range from 500 to 700° C. The auxiliary layer 10 protects the cell contacts 9 from undesired reactions during the deposition of the dielectric layer 11. Furthermore, the auxiliary layer 10 serves as a buffer layer, on which the dielectric layer 11 can be grown in a textured manner. If the dielectric layer 11 is formed from $Bi_4Ti_3O_{12}$, then the auxiliary layer is preferably provided of $ZrO_2$. The dielectric layer 11 is deposited by sputtering to a thickness of, for example, 500 nm.

Figure 2:
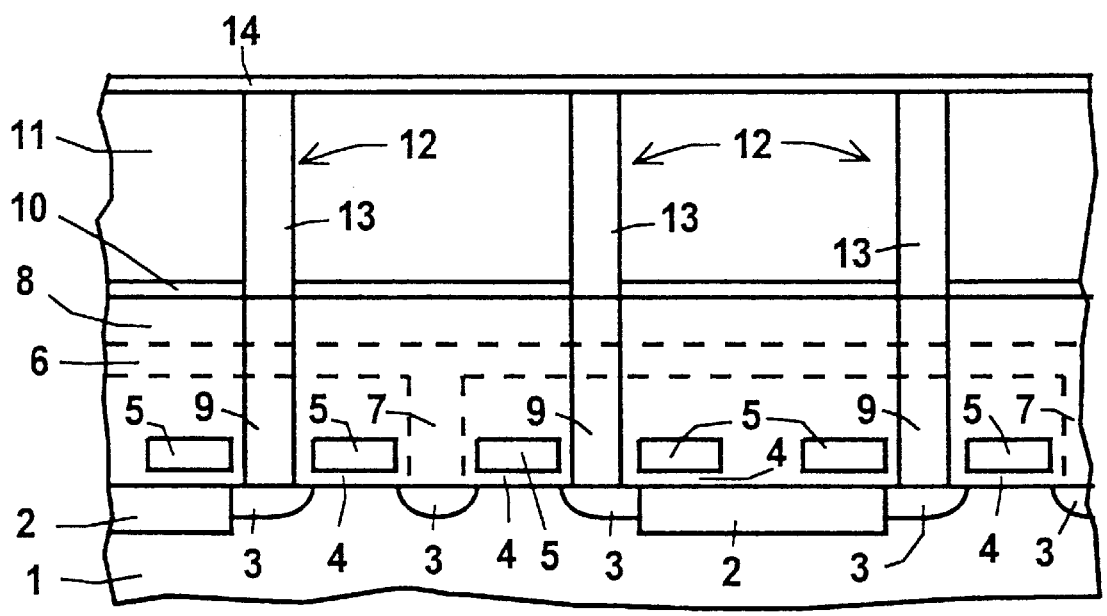
FIG. 2 is a fragmentary, vertical-sectional view showing the semiconductor layer structure following formation of first openings and first electrodes in the dielectric layer and following deposition of an insulation layer.

As is seen in FIG. 2, first openings 12 which are subsequently formed in the dielectric layer 11 have a configuration that corresponds to the configuration of the cell contacts and in each case at least partially expose the surface of the cell contact 9. In this case, both the dielectric layer 11 and the auxiliary layer 10 are etched through. The first openings 12 are provided with first electrodes 13 which are formed, for example, from aluminum, copper or tungsten and preferably completely fill the first openings 12. The first openings 12 preferably have the form of contact holes, with the result that the first electrodes 13 are constructed in the shape of columns.

An insulation layer 14 that is made, for example, of $SiO_2$ is deposited over the whole area to a thickness of, for example, 50 nm to 200 nm.

Figure 3:
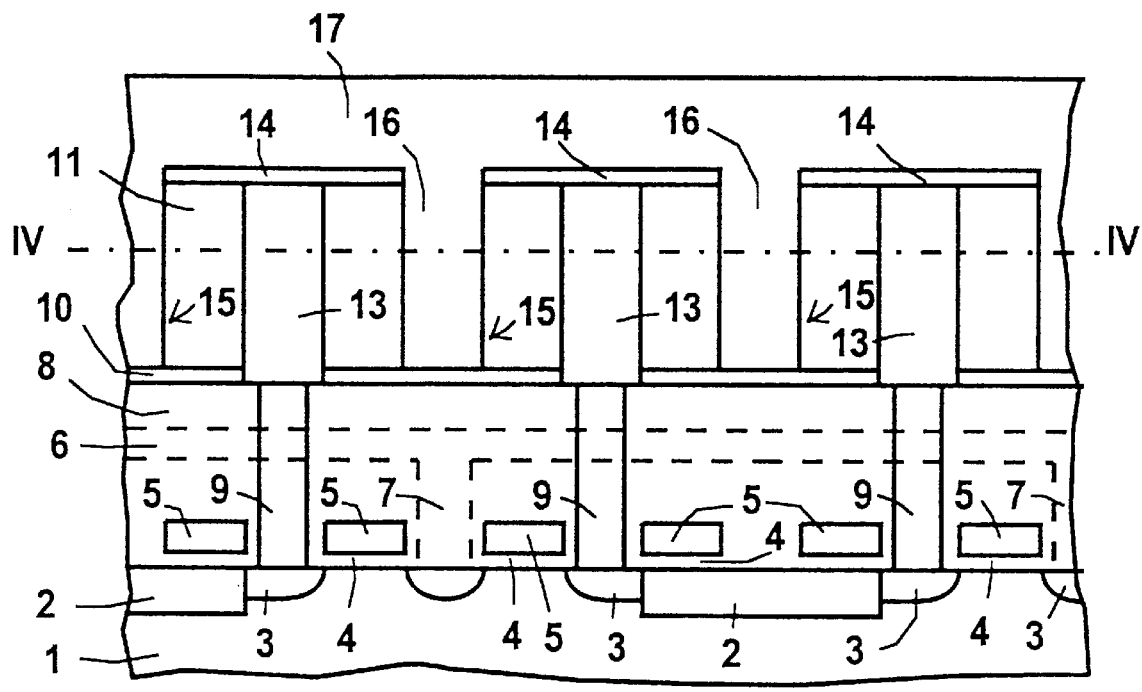
FIG. 3 is a fragmentary, vertical-sectional view showing the semiconductor layer structure following formation of second openings and second electrodes in the dielectric layer and formation of a capacitor plate.

As is seen in FIG. 3, second openings 15 which reach through the insulation layer 14 and the dielectric layer 11, are subsequently formed. A surface of the auxiliary layer 10 is exposed in the second openings 15. The second openings are filled by depositing a conductive layer which is made, for example, of aluminum, copper or tungsten. In the process second electrodes 16 are formed in the second openings 15. A capacitor plate 17 which electrically connects the second electrodes 16 to one another is formed at the same time.

Figure 4:
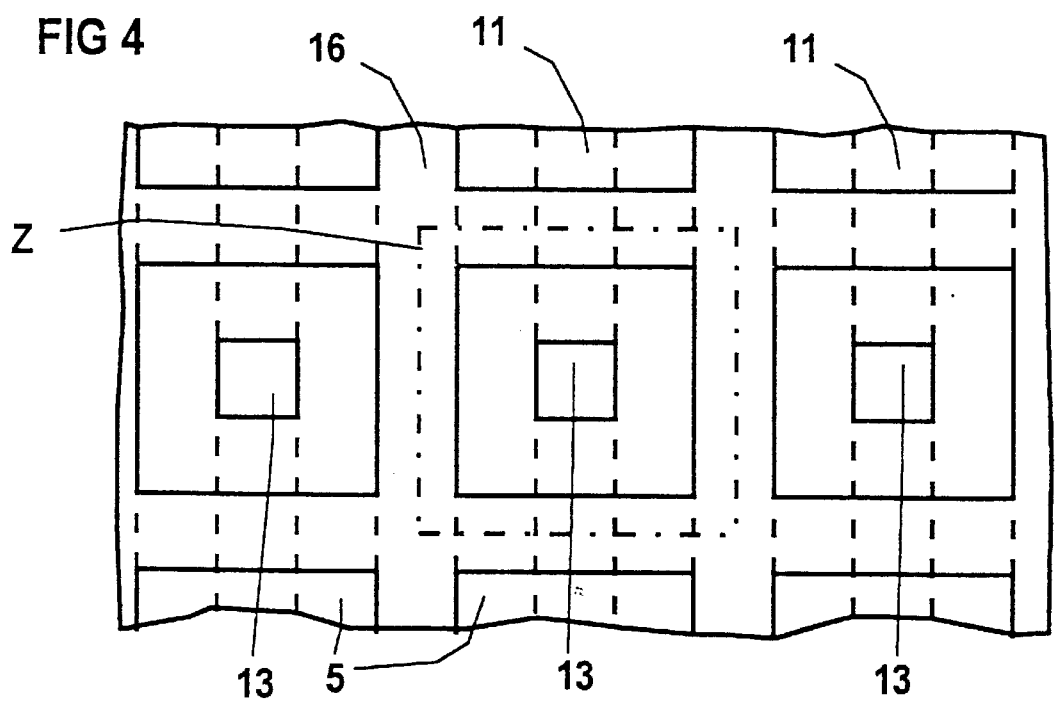
FIG. 4 is a fragmentary, cross-sectional view through the semiconductor layer structure, which is taken along a line IV—IV of FIG. 3.

The plan view of FIG. 4 shows that the second electrodes 16 in each case annually surround the first electrodes 13.

The second electrodes 16 which belong to adjacent memory cells adjoin one another and are thus electrically connected to one another.

The second electrodes 16 are insulated from the first electrodes 13 by the structured dielectric layer 11 as well as the structured insulation layer 14. The structured dielectric layer 11 likewise annularly surrounds the column-shaped first electrodes 13.

In FIG. 4, the area of a memory cell is indicated by a dot-dashed line bearing reference symbol Z. If the first electrodes 13 are set to the width of a minimum structure size F that can be produced, the width of the structured dielectric layer 11 is likewise set to correspond to F and the width of the second electrodes 16 is likewise set to correspond to F, then the area of the memory cell is Z 16 $F^2$. The capacitor area is 8 F×h, where h is the height of the dielectric layer 11.

Figure 5:
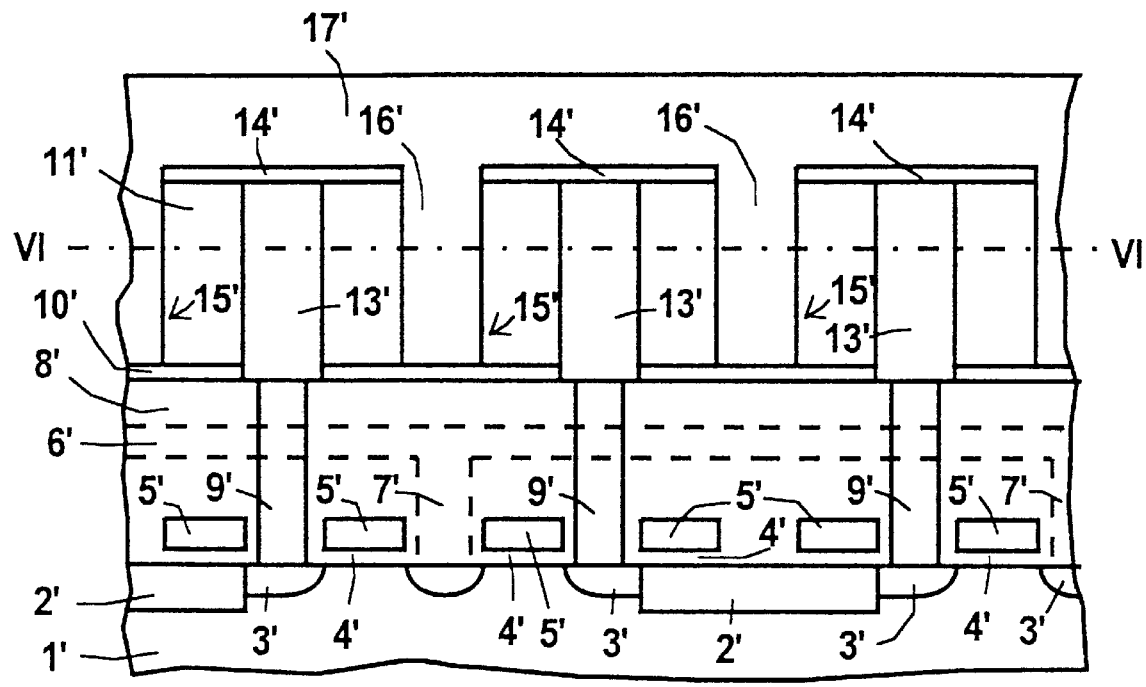
FIG. 5 is a fragmentary, vertical-sectional view showing a semiconductor layer structure having selection transistors, word lines, bit lines, an insulating layer, cell contacts and a storage capacitor disposed above the insulating layer.

In a second exemplary embodiment shown in FIG. 5, a memory cell configuration is realized in a substrate 1' analogously to the memory cell configuration which has been explained with reference to FIGS. 1 to 4. The memory cell configuration has insulation structures 2', selection transistors having source/drain regions 3', gate oxide 4' and word lines 5', bit lines 6' and bit line contacts 7' in the substrate 1' which are covered by an insulating layer 8' having a planar surface. Cell contacts 9' for the selection transistors are provided in the insulating layer 8'. Storage capacitors which each have a first electrode 13', a second electrode 16' and a structured dielectric layer 11' are disposed above the insulating layer 8'. An auxiliary layer 10' is disposed between the structured dielectric layer 11' and the insulating layer 8'. The second electrodes 16' are electrically connected to one another through the use of a capacitor plate 17'. The second electrodes 16' and the capacitor plate 17' are insulated from the first electrode 13' through the use of an insulation layer 14'.

This memory cell configuration is produced in a manner corresponding to the memory cell configuration which has been explained with reference to FIGS. 1 to 4. The various components are constructed to correspond to the corresponding components in the first exemplary embodiment.

Figure 6:
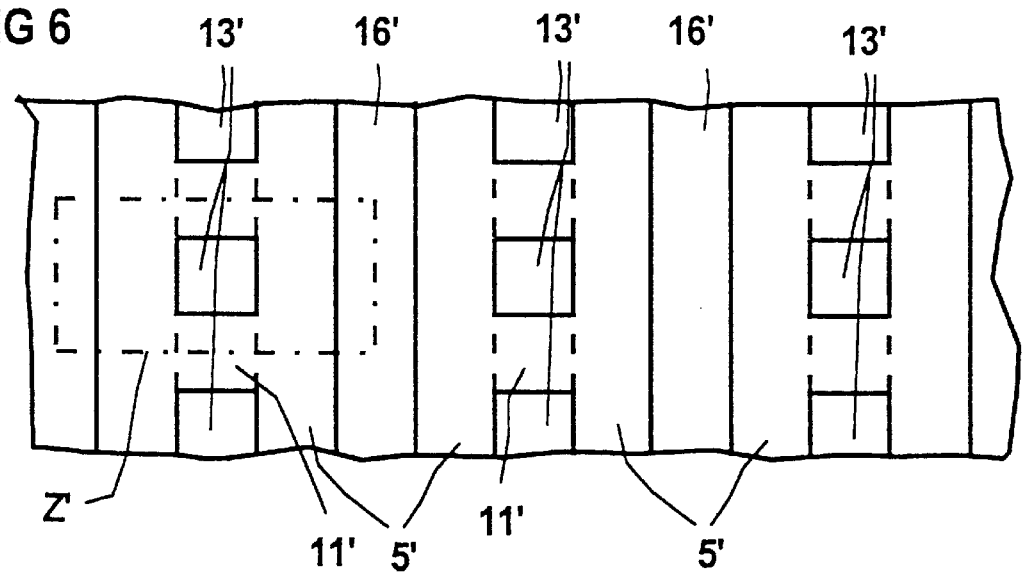
FIG. 6 is a fragmentary, cross-sectional view through the semiconductor layer structure, which is taken along a line VI—VI of FIG. 5.
Figure 7:
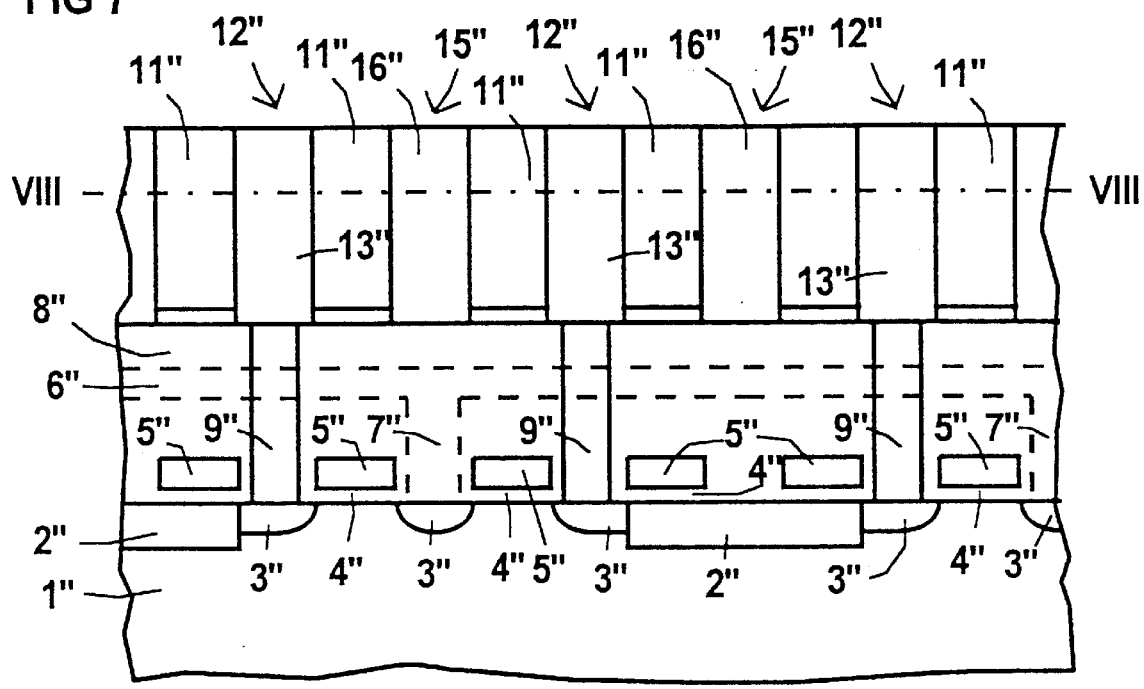
FIG. 7 is a fragmentary, vertical-sectional view showing a semiconductor layer structure having selection transistors, bit lines, word lines, an insulating layer, cell contacts and a storage capacitor, with first and second electrodes having been formed by the deposition of a conductive layer.

Unlike the first exemplary embodiment, the second electrodes 16' have a strip-shaped profile and run parallel to the word lines 5' across the memory cell configuration (see the plan view of FIG. 6). As in the first exemplary embodiment, the first electrodes 13' are constructed in the shape of columns. The minimum area for a memory cell Z' is 8 $F^2$ in the second exemplary embodiment, that is to say the memory cell configuration can be produced with an increased component density in the second exemplary embodiment. The capacitor area is 2×F×H, where H is the thickness of the dielectric layer 11'. The area of the storage capacitor can be adjusted by way of the thickness of the dielectric layer 11'.

In a third exemplary embodiment, insulation structures 2" and selection transistors having source/drain regions 3", gate oxide 4" and word lines 5" are formed in a substrate 1" made of monocrystalline silicon. Bit lines 6" and bit line contacts 7" as well as an insulating layer 8", which covers the bit lines 6", the word lines 5" and the selection transistors and has a planar surface, are produced. Cell contacts 9" are formed in the insulating layer 8" by opening contact holes and depositing tungsten, for example.

An auxiliary layer 10" is applied to the insulating layer 8" and a dielectric layer 11" is applied to the auxiliary layer. Up to this point, the production is effected as in the first and second exemplary embodiments. The various components are constructed to correspond to the corresponding components in the other exemplary embodiments.

Figure 8:
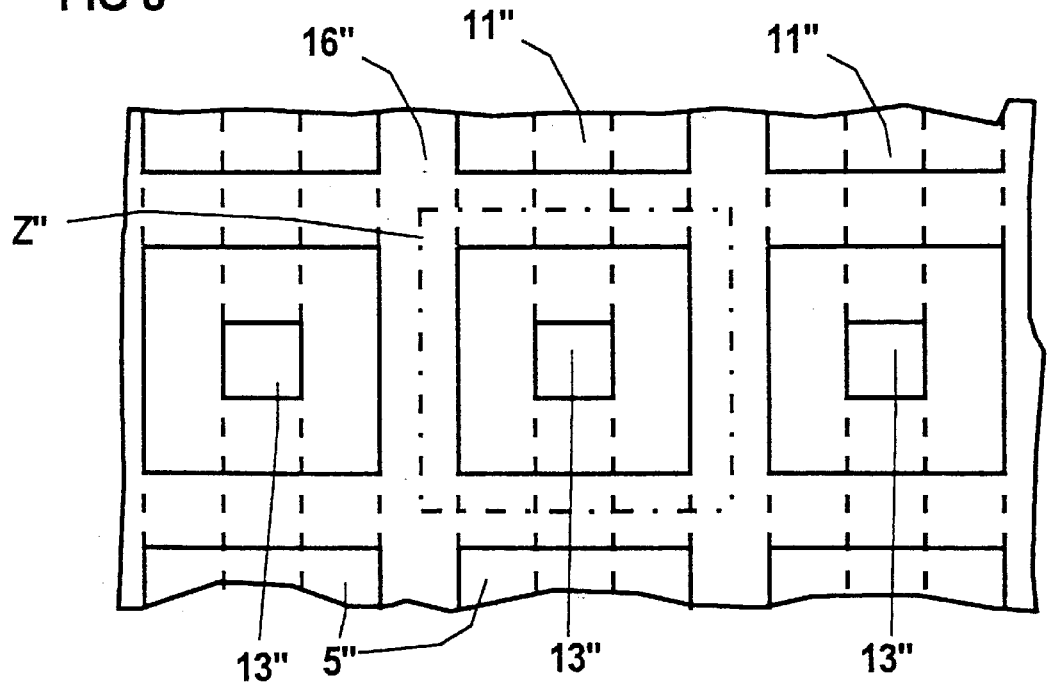
FIG. 8 is a fragmentary, cross-sectional view through the semiconductor layer structure, which is taken along a line VIII—VIII of FIG. 7.

First openings 12" and second openings 15" are then simultaneously produced in the dielectric layer 11" and the auxiliary layer 10". The first openings 12" in each case reach down to the surface of the cell contacts 9". The second openings 15" in each case annually surround the first openings 12" (see the plan view of FIG. 8).

A conductive layer, which completely fills both the first openings 12" and the second openings 15", is subsequently deposited over the whole area. The conductive layer is etched back to expose the surface of the dielectric layer 11" between the first openings 12" and the second openings 15". This produces the first electrodes 13" in the first openings 12" and the second electrodes 16" in the second openings 15". The second electrodes 16"0 for adjacent memory cells adjoin one another and in this way are electrically connected to one another. The second electrodes 16" are insulated from the first electrodes 13" through the use of the structured dielectric layer 11". Contact is made with the second electrodes 16" at the edge of the memory cell configuration.

In this embodiment of the invention, only one mask is required for forming the first openings 12' and the second openings 15". The deposition of one conductive layer is sufficient for forming the first electrodes 13" and the second electrodes 16". The first electrodes 13" and the second electrodes 16" are formed, for example, from aluminum, copper or tungsten.

The minimum area of a memory cell Z" is $16\ F^2$ in this exemplary embodiment, as in the first exemplary embodiment, where F is the minimum structure size that can be produced. The area of the storage capacitor is $8\ F \times h$, where h is the thickness of the dielectric layer 11".

The cell type which the memory cells of the exemplary embodiments embody is often referred to as a folded bit line stacked cell. The configuration of the word lines and bit lines corresponds to a capacitor over bit line construction.

We claim:

1. A memory cell configuration, comprising:
   a multiplicity of individual memory cells each including a selection transistor and a storage capacitor in a semiconductor layer structure;
   substantially parallel bit lines and substantially parallel word lines, said bit lines and said word lines extending transversely relative to one another;
   an insulating layer;
   at least said selection transistors being disposed below said insulating layer;
   said storage capacitors being disposed on said insulating layer;
   each of said storage capacitors including a column-shaped first electrode, a storage dielectric and a strip-shaped second electrode;
   said storage dielectric having ferroelectric or paraelectric material;
   said first electrode, said storage dielectric and said second electrode each being disposed next to one another above said insulating layer; and
   neighboring ones of said multiplicity of individual memory cells having neighboring first electrodes along a side of said strip-shaped second electrode, said neighboring first electrodes separated from each other only by said storage dielectric.

2. The memory cell configuration according to claim 1, wherein said storage dielectric includes at least one material selected from the group consisting of $BaTiO_3$, $SrTiO_3$, $(Ba,Sr)TiO_3$, $Ba(Ti,Zr)O_3$, lead zirconate titanate, $Bi_4Ti_2O_{12}$ and $SrBi_2Ta_2O_9$.

3. The memory cell configuration according to claim 1, wherein said bit lines and said word lines are disposed below said insulating layer.

4. The memory cell configuration according to claim 1, wherein said second electrodes run parallel to said word lines through the memory cell configuration.

5. The memory cell configuration according to claim 1, including a capacitor plate disposed above said first electrodes and said storage dielectrics and insulated from said first electrodes, said capacitor plate connecting said second electrodes to one another.

6. The memory cell configuration according to claim 1, wherein said storage dielectric has an exposed surface.

7. A memory cell configuration, comprising:
   a multiplicity of individual memory cells each including a selection transistor and a storage capacitor in a semiconductor layer structure;
   substantially parallel bit lines and substantially parallel word lines, said bit lines and said word lines extending transversely relative to one another;
   an insulating layer;
   at least said selection transistors being disposed below said insulating layer;
   said storage capacitors being disposed on said insulating layer;
   each of said storage capacitors including a column-shaped first electrode, a storage dielectric and a second electrode, a height of said first electrode being equal to a height of said second electrode;
   said storage dielectric annularly surrounding said first electrode and having ferroelectric or paraelectric material and an uncovered surface;
   said first electrode, said storage dielectric and said second electrode each being disposed next to one another above said insulating layer; and
   said second electrodes adjoining one another, electrically connecting each other, and surrounding said storage dielectric.

8. The memory cell configuration according to claim 7, wherein said second electrodes run parallel to said word lines through the memory cell configuration.

9. The memory cell configuration according to claim 7, wherein said storage dielectric includes at least one material selected from the group consisting of $BaTiO_3$, $SrTiO_3$, $(Ba,Sr)TiO_3$, $Ba(Ti,Zr)O_3$, lead zirconate titanate, $Bi_4Ti_2O_{12}$ and $SrBi_2Ta_2O_9$.

10. The memory cell configuration according to claim 7, wherein said bit lines and said word lines are disposed below said insulating layer.

11. The memory cell configuration according to claim 7, wherein said storage dielectric surrounds said first electrode.

12. The memory cell configuration according to claim 7, wherein said second electrodes adjoin one another and are electrically connected with each other.

13. The memory cell configuration according to claim 7, wherein said second electrodes together form a grid-shaped configuration.

14. The memory cell configuration according to claim 7, wherein an electrical contact to said second electrodes is connected at an edge of the memory cell configuration.

15. The memory cell configuration according to claim 7, wherein said bit lines and said word lines are disposed below said insulating layer.

16. A memory cell configuration, comprising:
    a multiplicity of individual memory cells each including a selection transistor and a storage capacitor in a semiconductor layer structure;
    substantially parallel bit lines and substantially parallel word lines, said bit lines and said word lines extending transversely relative to one another;
    an insulating layer;
    at least said selection transistors being disposed below said insulating layer;

said storage capacitors being disposed on said insulating layer;

each of said storage capacitors including a column-shaped first electrode, a storage dielectric and a second electrode, a height of said first electrode being equal to a height of said second electrode;

said storage dielectric annularly surrounding said first electrode and having ferroelectric or paraelectric material and an uncovered surface, said storage dielectric defining first and second openings;

said first electrode, said storage dielectric and said second electrode each being disposed next to one another above said insulating layer;

said first electrode and said second electrode each disposed in respective ones of said first and second openings in said storage dielectric; and said second electrodes adjoining one another, electrically connecting each other, and surrounding said storage dielectric.

17. The memory cell configuration according to claim 16, wherein said second electrodes run parallel to said word lines through the memory cell configuration.

18. The memory cell configuration according to claim 16, wherein said storage dielectric includes at least one material selected from the group consisting of $BaTiO_3$, $SrTiO_3$, $(Ba,Sr)TiO_3$, $Ba(Ti,Zr)O_3$, lead zirconate titanate, $Bi_4Ti_2O_{12}$ and $SrBi_2Ta_2O_9$.

19. The memory cell configuration according to claim 16, wherein said bit lines and said word lines are disposed below said insulating layer.

20. The memory cell configuration according to claim 16, wherein said storage dielectric surrounds said first electrode.

21. The memory cell configuration according to claim 16, wherein said second electrodes adjoin one another and are electrically connected with each other.

22. The memory cell configuration according to claim 16, wherein said second electrodes together form a grid-shape configuration.

23. The memory cell configuration according to claim 16, wherein an electrical contact to said second electrodes is connected at an edge of the memory cell configuration.

24. The memory cell configuration according to claim 16, wherein said bit lines and said word lines are disposed below said insulating layer.

* * * * *